(12) United States Patent
Kim et al.

(10) Patent No.: US 7,989,943 B2
(45) Date of Patent: Aug. 2, 2011

(54) STAIRCASE SHAPED STACKED SEMICONDUCTOR PACKAGE

(75) Inventors: Seung Jee Kim, Gyeonggi-do (KR); Jae Myun Kim, Gyeonggi-do (KR); Kyoung Mo Yang, Gyeonggi-do (KR)

(73) Assignee: Hynix Semiconductor Inc., Hyeonggi-do (KR)

( * ) Notice: Subject to any disclaimer, the term of this patent is extended or adjusted under 35 U.S.C. 154(b) by 118 days.

(21) Appl. No.: 12/492,224

(22) Filed: Jun. 26, 2009

(65) Prior Publication Data
US 2010/0258929 A1 Oct. 14, 2010

(30) Foreign Application Priority Data

Apr. 10, 2009 (KR) .................. 10-2009-0031425

(51) Int. Cl.
*H01L 23/02* (2006.01)
(52) U.S. Cl. ..................... 257/686; 257/777
(58) Field of Classification Search .................. 257/686, 257/777, 723, 724
See application file for complete search history.

(56) References Cited

U.S. PATENT DOCUMENTS

| | | | | |
|---|---|---|---|---|
| 7,663,246 | B2* | 2/2010 | Chen et al. | ..................... 257/777 |
| 2005/0067694 | A1 | 3/2005 | Pon et al. | |
| 2006/0290005 | A1* | 12/2006 | Thomas et al. | ............... 257/777 |
| 2007/0262346 | A1* | 11/2007 | Otremba et al. | .............. 257/177 |
| 2008/0061421 | A1* | 3/2008 | Shen et al. | ..................... 257/686 |
| 2008/0197472 | A1* | 8/2008 | Matsushiima | ............... 257/686 |
| 2009/0166839 | A1* | 7/2009 | Suzuki et al. | ................. 257/686 |
| 2009/0243067 | A1* | 10/2009 | Camacho et al. | ............ 257/686 |
| 2010/0181661 | A1* | 7/2010 | Takemoto et al. | ........... 257/686 |
| 2010/0200976 | A1* | 8/2010 | Nishiyama et al. | .......... 257/686 |
| 2010/0265751 | A1* | 10/2010 | Hong | .............................. 365/51 |
| 2010/0270689 | A1* | 10/2010 | Kim et al. | ..................... 257/777 |
| 2010/0301466 | A1* | 12/2010 | Taoka et al. | ................... 257/686 |

FOREIGN PATENT DOCUMENTS

| | | |
|---|---|---|
| KR | 1020010009995 A | 2/2001 |
| KR | 1020020028474 A | 4/2002 |
| KR | 1020070088177 A | 8/2007 |
| KR | 1020080077566 A | 8/2008 |

* cited by examiner

*Primary Examiner* — S. V Clark
(74) *Attorney, Agent, or Firm* — Ladas & Parry LLP

(57) ABSTRACT

A staircase shaped stacked semiconductor package is presented which includes a substrate, a multiplicity of semiconductor chip modules, a connection member, and conductive members. The substrate has connection pads along an upper surface edge. Each semiconductor chip module includes a first and a second semiconductor chip that oppose each other. The first and second semiconductor chips have respective first and second bonding pads along exposed surfaces. The connection member is placed on an uppermost semiconductor chip module and has first and second terminals electrically connected to the first and second bonding pads via conductive members. The conductive members are also coupled to the connection pads of the substrate.

19 Claims, 10 Drawing Sheets

US 7,989,943 B2

STAIRCASE SHAPED STACKED SEMICONDUCTOR PACKAGE

CROSS-REFERENCE TO RELATED APPLICATIONS

The present application claims priority to Korean patent application number 10-2009-0031425 filed on Apr. 10, 2009, which is incorporated herein by reference in its entirety.

BACKGROUND OF THE INVENTION

The present invention relates to a stacked semiconductor package, more particular to a staircase shaped stacked semiconductor package.

These days, semiconductor chips are capable of storing and processing huge amounts of data. Semiconductor packages having these semiconductor chips have been developed.

Recently, a stacked semiconductor package, in which at least two semiconductor chips has been proposed. These stacked semiconductor packages promise to increase data storage capacities and data processing speeds.

In order to realize the stacked semiconductor package concept, vertically stacked semiconductor chips must be electrically connected with one another by using interconnecting conductive wires. In the case where the vertically stacked semiconductor chips are electrically connected using the conductive wires, problems arise due to the increase in volume of the stacked semiconductor packages.

BRIEF SUMMARY OF THE INVENTION

Embodiments of the present invention are directed to a stacked semiconductor package which has a decreased volume and can increase the number of semiconductor chips to be stacked and improve data storage capacity and data processing speed.

In one embodiment of the present invention, a stacked semiconductor package comprises a substrate having connection pads placed on an edge of an upper surface thereof; semiconductor chip modules including first semiconductor chips which have first bonding pads placed in a face-down type and positioned outside the substrate and second semiconductor chips which are placed on lower surfaces of the first semiconductor chips and have second bonding pads placed in a face-up type to face away from the first bonding pads; connection members having first terminals which are placed on an uppermost second semiconductor chip and second terminals which are positioned outside the uppermost second semiconductor chip; and conductive members having first conductive members which connect the connection pads, the second bonding pads and the first terminals and second conductive members which connect the second terminals and the first bonding pads.

The semiconductor chip modules can also include adhesive members which attach the first and second semiconductor chips to each other.

The first and second semiconductor chips of the semiconductor chip modules have the same size.

At least two semiconductor chip modules are stacked in such a way as to define the shape of steps.

The first and second bonding pads of the first and second semiconductor chips are stacked in such a way as to face away from each other.

The first and second conductive members comprise conductive wires.

The substrate can also have a receiving groove which is defined to correspond to the second conductive members and receives the second conductive members.

The substrate can also have an opening which is defined to correspond to the second conductive members and exposes the second bonding pads and the second terminals.

The first conductive members can be conductive wires, and the second conductive members can be strip shaped conductive tapes.

The first and second conductive members can also be strip shaped conductive tapes.

The first and second conductive members can comprise wiring parts composed of conductive rheological particles that have first polarity and second polarity opposite to the first polarity are electrically connected with one another and insulation parts which enclose the wiring parts.

The substrate can also includes power connection terminals. The power connection terminals and the first terminals are electrically connected with each other by the conductive members.

The connection members can also include insulation layers which have openings for exposing the first and second terminals.

In another embodiment of the present invention, a stacked semiconductor package comprises a substrate having connection pads placed on an edge of an upper surface thereof; semiconductor chip modules including first semiconductor chips which have first bonding pads placed in a face-down type and positioned outside the substrate and second semiconductor chips which are placed on lower surfaces of the first semiconductor chips and have second bonding pads placed in a face-up type to face away from the first bonding pads; connection members having first terminals which are placed on an uppermost second semiconductor chip and second terminals which are positioned outside the uppermost second semiconductor chip; and conductive members connecting the connection pads, the second bonding pads and the first terminals; and a connection block placed on the substrate, and having a connection block body which has a configuration defining steps to be engaged with the upper and side surfaces of the first semiconductor chips and connection patterns which are placed on the connection block body and connect the second terminals and the first bonding pads.

The connection patterns be strip shaped conductive tapes.

The first and second bonding pads of the first and second semiconductor chips are stacked in such a way as to face away from each other.

In still another embodiment of the present invention, a stacked semiconductor package comprises a substrate having connection pads placed on an edge of an upper surface thereof; semiconductor chip modules including first semiconductor chips which have first bonding pads placed in a face-down type and positioned outside the substrate and second semiconductor chips which are placed on lower surfaces of the first semiconductor chips and have second bonding pads placed in a face-up type to face away from the first bonding pads; and conductive member sequentially connected with the connection pads, the second bonding pads and the first bonding pads.

The conductive member can comprise flexible body and conductive pattern which is placed on the flexible body and is connected with the connection pads, the second bonding pads and the first bonding pads.

The first and second bonding pads of the first and second semiconductor chips are stacked in such a way as to face away from each other.

The conductive member may be lead frames.

DESCRIPTION OF SPECIFIC EMBODIMENTS

Figure 1:
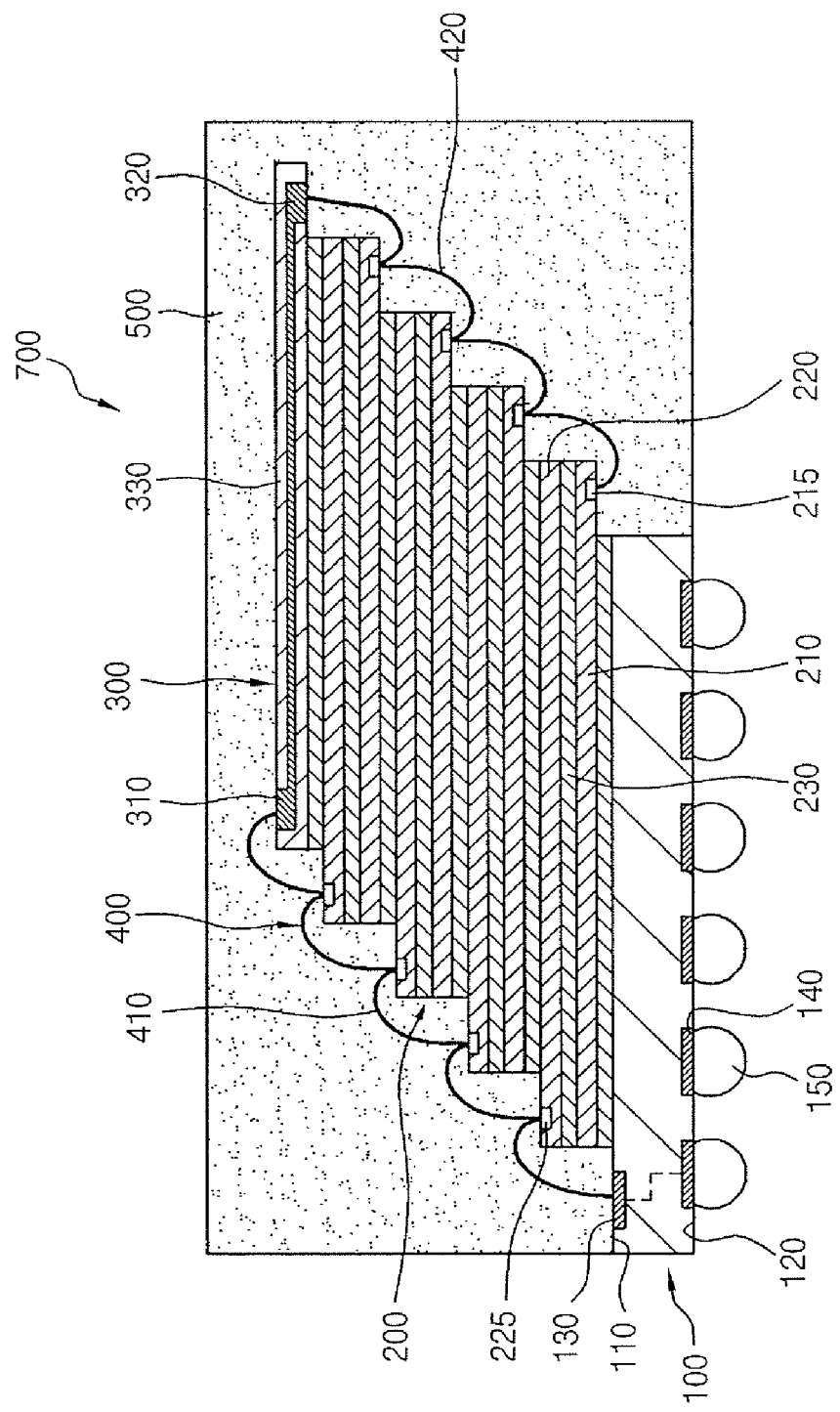
FIG. 1 is a sectional view illustrating a stacked semiconductor package in accordance with a first embodiment of the present invention.

FIG. 1 is a sectional view illustrating a stacked semiconductor package in accordance with a first embodiment of the present invention. It is understood herein that the drawings are not necessarily to scale and in some instances proportions may have been exaggerated in order to more clearly depict certain features of the invention.

Referring now to FIG. 1, a stacked semiconductor package 5700 is shown to include a substrate 100, semiconductor chip modules 200, at least one connection member 300, and conductive members 400. The semiconductor chip modules 200 are placed on the substrate 100, and the connection member 300 is placed on the uppermost semiconductor chip module 200. The conductive members 400 are electrically connected to the substrate 100, to the semiconductor chip modules 200 and to the connection member 300.

The substrate 100 can comprise a printed circuit board which has a plate shape. The substrate 100 can include connection pads 130, ball lands 140 and connection elements 150. In the present embodiment, the surface area of the substrate 100 is substantially the same as that of first and second semiconductor chips which are included in each semiconductor chip module 200.

The connection pads 130 are preferably placed along an edge of an upper surface 110 of the substrate 100. The ball lands 140 are preferably placed on a lower surface 120 of the substrate 100 which faces away from the upper surface 110. The connection pads 130 and the ball lands 140 are electrically connected together. The connection elements 150 are electrically connected to the respective ball lands 140.

Figure 2:
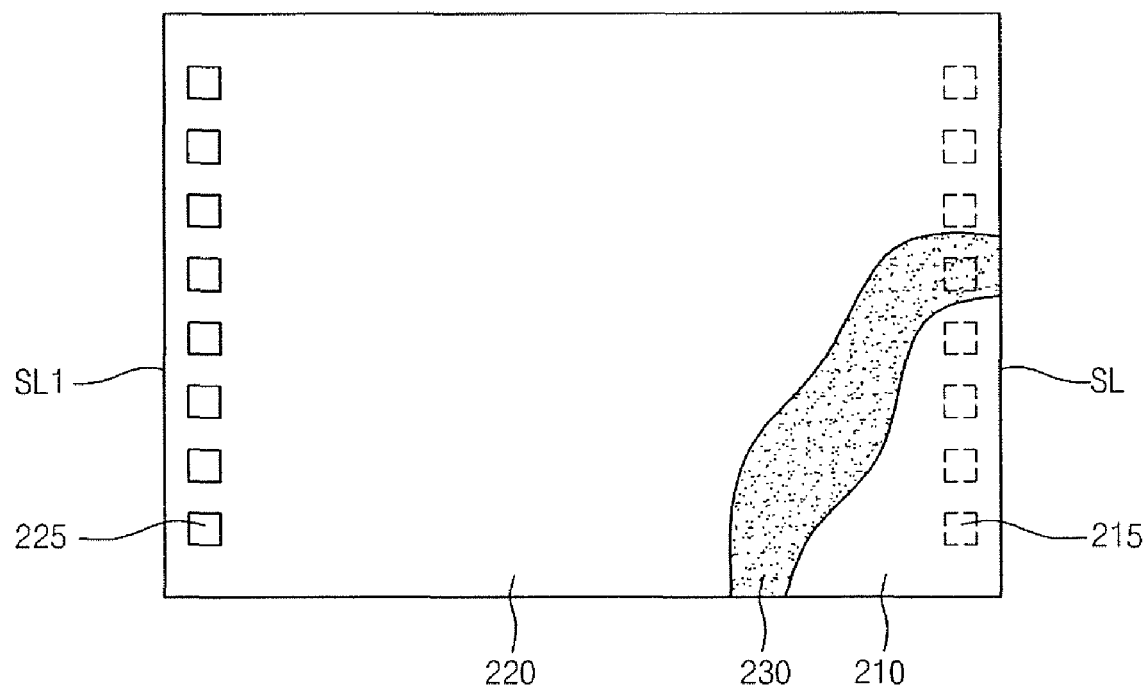
FIG. 2 is a plan view of a semiconductor chip module shown in FIG. 1.

FIG. 2 is a plan view of a semiconductor chip module shown in FIG. 1.

Referring now to FIGS. 1 and 2, each semiconductor chip module 200 includes a first semiconductor chip 210, a second semiconductor chip 220 and an adhesive member 230. In the present embodiment depicts, for example, four semiconductor chip modules 200 each having the first semiconductor chip 210, the second semiconductor chip 220 and the adhesive member 230. Each of semiconductor chip modules 200 are stacked in the form of steps along the upper surface 110 of the substrate 100.

The first semiconductor chip 210 has first bonding pads 215 which are electrically connected to a circuit section (not shown). The first bonding pads 215 are placed on the upper surface of the first semiconductor chip 210. The first bonding pads 215 are preferably placed along one edge SL of the upper surface of the first semiconductor chip 210.

The second semiconductor chip 220 has second bonding pads 225 which are electrically connected to a circuit section (not shown). The second bonding pads 225 are placed along on the upper surface of the second semiconductor chip 220. The second bonding pads 225 are placed along one edge SL1 of the upper surface of the second semiconductor chip 220.

In the present embodiment, the first and second semiconductor chips 210 and 220 may be the same kind of semiconductor chips which have the same shape and size and perform the same function.

The adhesive member 230 is interposed between the first semiconductor chip 210 and the second semiconductor chip 220. In the present embodiment, the adhesive member 230 adheres together the lower surface of the first semiconductor chip 210 and to the lower surface of the second semiconductor chip 220.

The first and second bonding pads 215 and 225 of the first and second semiconductor chips 210 and 220 which are attached to each other by the adhesive member 230 are placed at different positions. For example, the first and second bonding pads 215 and 225 of the first and second semiconductor chips 210 and 220 can be placed in such a way as to be opposite or even perpendicular to each other. In the present embodiment, the first and second bonding pads 215 and 225 of the first and second semiconductor chips 210 and 220 are placed opposite to each other.

In the first semiconductor chip 210 of the semiconductor chip module 200, the upper surface, on which the first bonding pads 215 are formed, faces the upper surface 110 of the substrate 100. The first bonding pads 215 are positioned outside the substrate 100, and due to this configuration, the first bonding pads 215 are exposed out from the substrate 100. As a consequence, the second bonding pads 225 of the second semiconductor chip 220 are positioned adjacent to the connection pads 130 of the substrate 100.

The semiconductor chip modules 200 shown in FIGS. 1&2 are placed in the form of steps as shown in FIG. 1. Due to this fact, the first and second bonding pads 215 and 225 of the first and second semiconductor chips 210 and 220 are exposed to the outside.

The first bonding pads 215 of the first semiconductor chip 210 are placed in a face-down orientation on the upper surface 110 of the substrate 100, and the second bonding pads 225 of the second semiconductor chip 220 are placed in a face-up orientation on the upper surface 110 of the substrate 100. The respective semiconductor chip modules 200, which are stacked in the form of steps, are then attached to one another by adhesive members.

Referring again to FIG. 1, the connection members 300 are placed on the second semiconductor chip 220 of the uppermost semiconductor chip module 200.

The connection member 300 can comprise, for example, metal plates preferably which have strip shapes. The connection member 300 is attached by the adhesive member placed on the second semiconductor chip 220 of the uppermost semiconductor chip module 200. The connection member 300 has first terminals 310 and second terminals 320 which are preferably opposite to each other. The first terminals 310 of the connection member 300 are placed on the second semiconductor chip 220 of the uppermost semiconductor chip module 200. The second terminals 320 of the connection member 300 are positioned outside the second semiconductor chip 220 of the uppermost semiconductor chip module 200.

In the present embodiment, the connection member 300 can also include an insulation layer 330. The insulation layer 330 can be formed on both surfaces of the connection member 300. Openings are defined in the insulation layer 330 to expose the first and second terminals 310 and 320.

Referring again to FIG. 1, the conductive members 400 include first conductive members 410 and second conductive members 420.

The first conductive members 410 are electrically connected to the connection pads 130 of the substrate 100, to the second bonding pads 225 of the second semiconductor chips 220, and to the first terminals 310 of the connection members 300.

The second conductive members 420 are electrically connected to the first bonding pads 215 of the first semiconductor chips 210 and to the second terminals 320 of the connection members 300.

In the present embodiment, the first and second conductive members 410 and 420 can be composed of conductive wires. In the case where the first semiconductor chips 210 of the semiconductor chip modules 200 of the stacked semiconductor package 700 shown in FIG. 1 are exposed away from the substrate 100 and the second conductive members 420 can be conductive wires. In this case, the substrate 100 and the second conductive members 420 do not interfere with each other.

A molding member 500 encapsulates the semiconductor chip modules 200, the connection member 300 and the conductive members 400 so that the semiconductor chip modules 200, the connection members 300 and the conductive members 400 are protected from being broken by external shocks and vibrations. In the present embodiment, the molding member 500 is preferably an epoxy resin.

The signals generated from the first semiconductor chips 210 which are included in the semiconductor chip modules 200 of the stacked semiconductor package 700 are inputted to the connection pads 130 via the second conductive members 420, the connection members 300 and the first conductive members 410. Also signals outputted from the connection pads 130 are applied to the first semiconductor chips 210 of the semiconductor chip modules 200 via the first conductive members 410, the connection members 300 and the second conductive members 420.

In order to manufacture the stacked semiconductor package 700 as shown in FIG. 1, the substrate 100 having the connection pads 130, the semiconductor chip modules 200 having the first and second semiconductor chips 210 and 220, and the connection member 300 are first prepared separately.

Then, the semiconductor chip modules 200 are attached to the upper surface 110 of the substrate 100. The upper surface 110 of the substrate 100 and the first semiconductor chips 210 of the semiconductor chip modules 200 are aligned to face each other so that the first bonding pads 215 of the first semiconductor chips 210 are positioned outside the substrate 100. At least two semiconductor chip modules 200 are placed in a step-like configuration.

The connection members 300 are placed on the second semiconductor chip 220 of the uppermost semiconductor chip module 200. The first terminals 310 of the connection members 300 are placed on the second semiconductor chip 220, and the second terminals 320 of the connection members 300 are aligned outside the second semiconductor chip 220.

Next, the connection pads 130, the second bonding pads 225 and the first terminals 310 are electrically connected to one another by the first conductive members 410. In the present embodiment, the first conductive members 410 can be conductive wires.

Thereafter, after the semiconductor chip modules 200 are turned upside down such that the substrate 100 is placed uppermost, the second terminals 320 of the connection members 300 and the first bonding pads 215 are then electrically connected to each other by the second conductive members 420. In the present embodiment, the second conductive members 420 can be conductive wires.

Thereupon, molding is implemented using the molding member 500, whereby the manufacturing of the stacked semiconductor package 700, as shown in FIG. 1, is completed.

Figure 3:
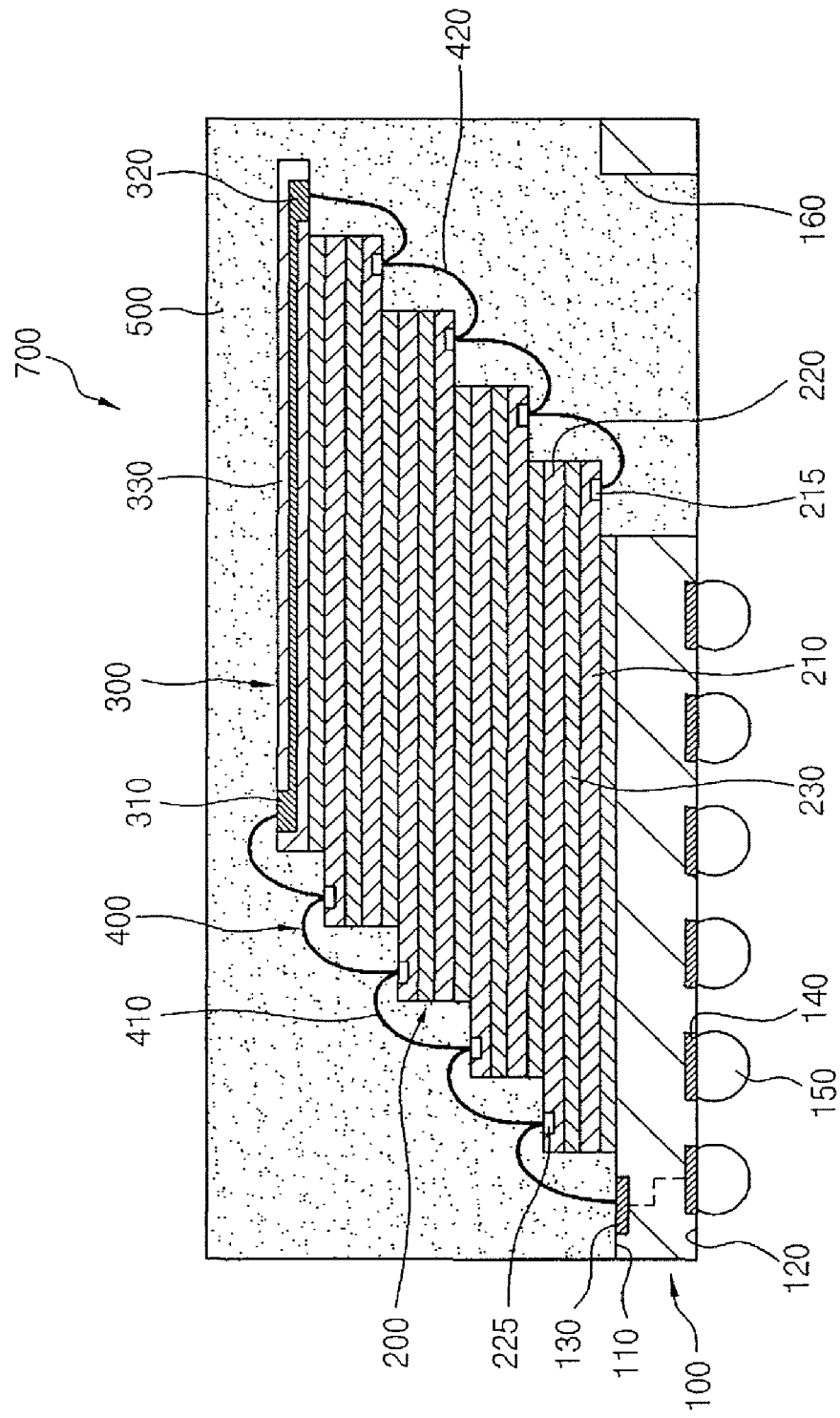
FIG. 3 is a sectional view illustrating a stacked semiconductor package in accordance with a second embodiment of the present invention.

FIG. 3 is a sectional view illustrating a stacked semiconductor package in accordance with a second embodiment of the present invention. The stacked semiconductor package shown in FIG. 3 has substantially the same construction as the stacked semiconductor package which is described above with reference to FIG. 1, except a substrate. Therefore, detailed description for the same component elements will be omitted herein, and the same technical terms and the same reference numerals will be used to refer to the same or like component elements.

The stacked semiconductor package 700 includes a substrate 100, semiconductor chip modules 200, connection members 300, and conductive members 400. The semiconductor chip modules 200 are placed on the substrate 100, and the connection members 300 are placed on the uppermost semiconductor chip module 200. The conductive members 400 electrically connect together the substrate 100, the semiconductor chip modules 200 and the connection members 300.

The substrate 100 can comprise a printed circuit board which preferably has a plate shape. The substrate 100 includes connection pads 130, ball lands 140, connection elements 150, and an opening 160. In the present embodiment, the surface area of the substrate 100 is greater than that of the semiconductor chip modules 200.

The connection pads 130 are placed along an edge of an upper surface 110 of the substrate 100, and the ball lands 140 are placed along a lower surface 120 of the substrate 100 which faces away from the upper surface 110. The connection pads 130 and the ball lands 140 are electrically connected with each other. The connection elements 150 are electrically connected to the respective ball lands 140.

The opening 160 of the substrate 100 exposes the first bonding pads 215 of the first semiconductor chips 210 of the semiconductor chip modules 200 and the second terminals 320. The second conductive members 420, such as conductive wires, are easily connected electrically to the first bonding pads 215 and to the second terminals 320 through the opening 160.

In order to manufacture the stacked semiconductor package 700 shown in FIG. 3, first, the substrate 100 having the connection pads 130 and the opening 160, the semiconductor chip modules 200 including the first and second semiconductor chips 210 and 220, and the connection members 300 are separately prepared.

Then, one of the semiconductor chip modules 200 is attached to the upper surface 110 of the substrate 100. The upper surface 110 of the substrate 100 and the first semiconductor chips 210 of the semiconductor chip modules 200 face each other, and the first bonding pads 215 of the first semiconductor chips 210 are positioned outside the substrate 100. At least two semiconductor chip modules 200 are placed in a stepwise manner. The first bonding pads 215 of the semiconductor chip modules 200, which are attached to the substrate 100, and the second terminals 320 of the connection members 300 are aligned to be exposed through the opening 160 which is defined through the substrate 100.

Next, the connection pads 130, the second bonding pads 225 and the first terminals 310 are electrically connected to one another by the first conductive members 410. In the present embodiment, the first conductive members 410 can preferably be conductive wires.

Thereafter, after the semiconductor chip modules 200 are turned upside down such that the substrate 100 is placed uppermost, the second terminals 320 of the connection members 300 and the first bonding pads 215 are then electrically connected to each other through the opening 160 of the substrate 100 by the second conductive members 420. In the present embodiment, the second conductive members 420 can preferably be conductive wires.

Thereupon, molding is implemented using the molding member 500 to encase the stacked semiconductor package 700 shown in FIG. 3 completes the manufacturing.

Figure 4:
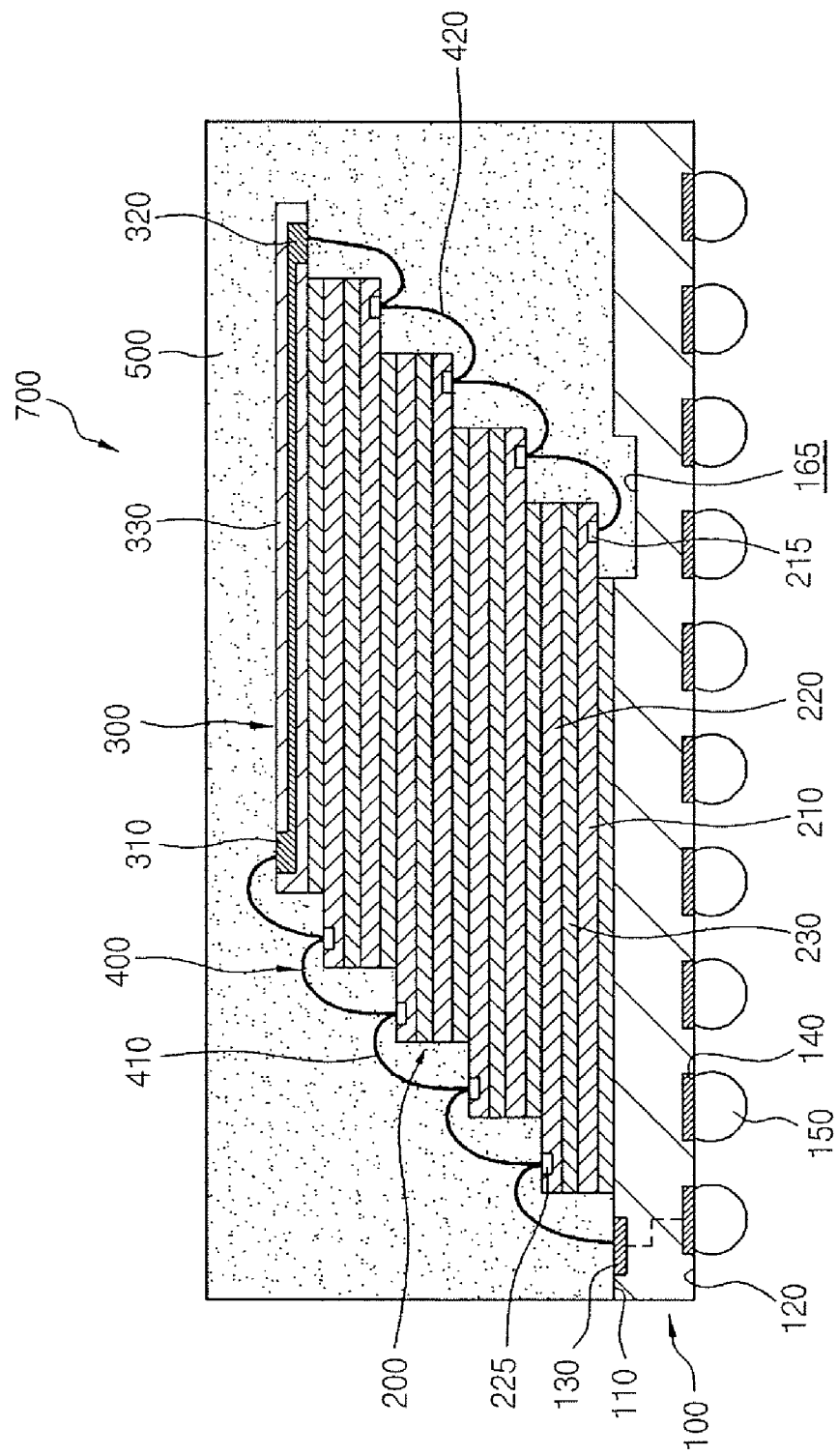
FIG. 4 is a sectional view illustrating a stacked semiconductor package in accordance with a third embodiment of the present invention.

FIG. 4 depicts a sectional view illustrating a stacked semiconductor package in accordance with a third embodiment of the present invention. The stacked semiconductor package shown in FIG. 4 has substantially the same construction as that of the stacked semiconductor package which is described above with reference to FIG. 1, except for the substrate. Therefore, detailed description for the same component elements will be omitted herein, and the same technical terms and the same reference numerals will be used to refer to the same or similar component elements.

A stacked semiconductor package 700 includes a substrate 100 having connection pads 130 and a receiving groove 165, semiconductor chip modules 200, at least one connection member 300, and conductive members 400. The semiconductor chip modules 200 are sequentially placed or stacked onto the substrate 100, and the connection member 300 is placed on the uppermost stacked semiconductor chip module 200. The conductive members 400 electrically connect together the substrate 100, the semiconductor chip modules 200 and the connection member 300.

The substrate 100 can comprise a printed circuit board that preferably has a plate like shape. The substrate 100 includes the connection pads 130, ball lands 140, connection elements 150, and the receiving groove 165. In the present embodiment, the surface area of the substrate 100 is preferably greater than that of the semiconductor chip modules 200.

The connection pads 130 are placed along an edge of an upper surface 110 of the substrate 100, and the ball lands 140 are placed along a lower surface 120 of the substrate 100 which faces away from the upper surface 110. The connection pads 130 and the ball lands 140 are electrically connected to each other. The connection elements 150 are electrically connected to the respective ball lands 140.

The receiving groove 165 of the substrate 100 receives the second conductive members 420, which are connected to the first bonding pads 215 of the first semiconductor chip 210 of the lowermost semiconductor chip module 200, so as to protect the upper surface 110 of the substrate 100 and the second conductive members 420 from interfering with each other.

Figure 5:
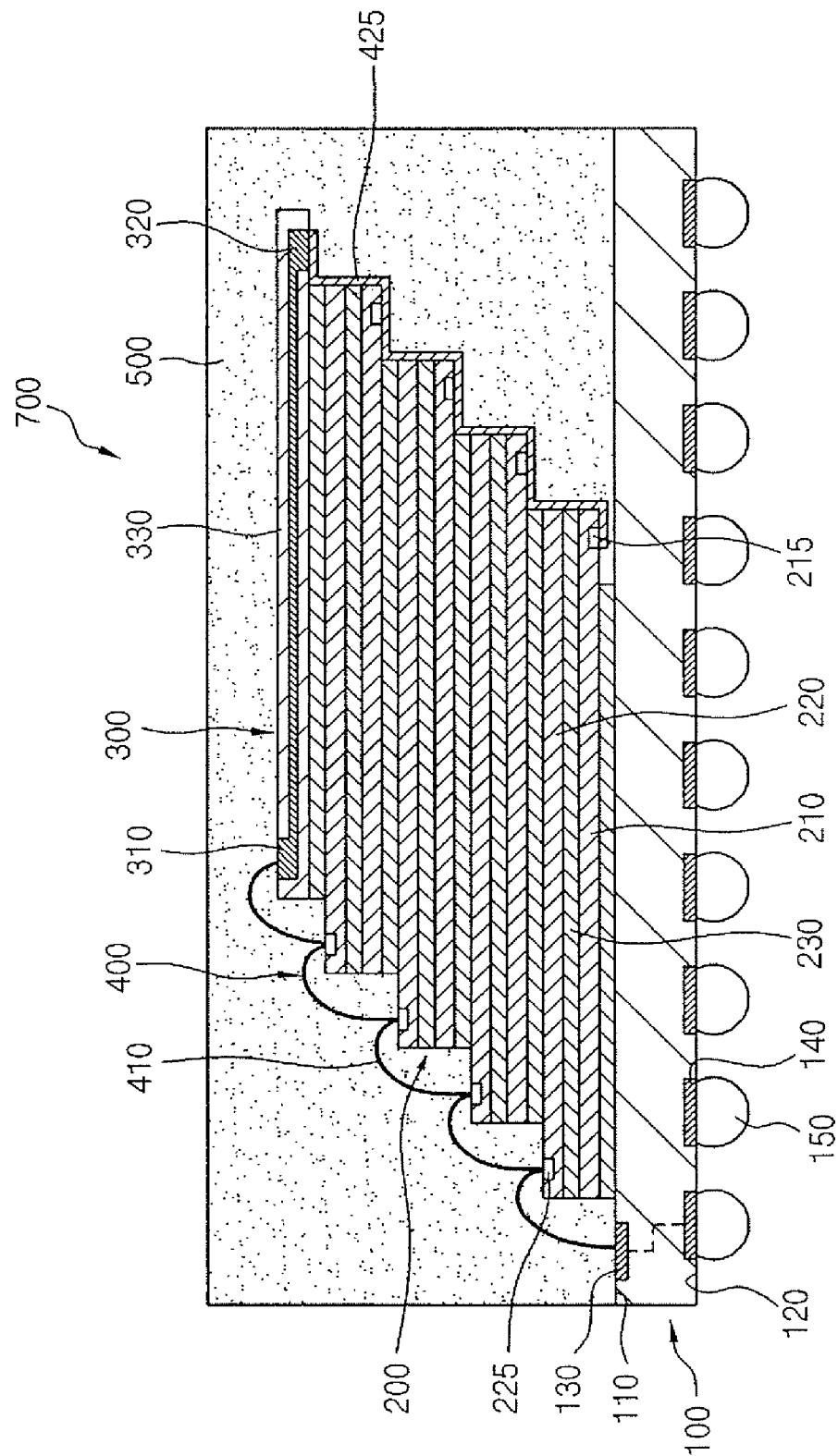
FIG. 5 is a sectional view illustrating a stacked semiconductor package in accordance with a fourth embodiment of the present invention.

FIG. 5 is a sectional view illustrating a stacked semiconductor package in accordance with a fourth embodiment of the present invention. The stacked semiconductor package shown in FIG. 5 has substantially the same construction as the stacked semiconductor package which is described above with reference to FIG. 1, except with regards to second conductive members. Therefore, detailed description for the same component elements will be omitted herein, and the same technical terms and the same reference numerals will be used to refer to the same or like component elements.

A stacked semiconductor package 700 includes a substrate 100 having connection pads 130, semiconductor chip modules 200, at least one connection member 300, and conductive members 400 having first and second conductive members 410 and 425. The semiconductor chip modules 200 are placed or stacked onto the substrate 100, and the connection member 300 is placed on the uppermost semiconductor chip module 200. The conductive members 400 electrically connect together the substrate 100, the semiconductor chip modules 200 and the connection members 300.

In the present embodiment, the first conductive members 410 can be conductive wires which electrically connect to the connection pads 130 placed on an upper surface 110 of the substrate 100, to the second bonding pads 225 of the second semiconductor chips 220, and to the first terminals 310.

In the case where the second conductive members 425 comprise conductive wires as in the first conductive members 410, the size of the substrate 100 is limited as can be readily seen from FIG. 1, and the opening 160 or the receiving groove 165 should be defined in the substrate 100 as shown in FIGS. 3 and 4.

In the present embodiment, the second conductive members 425 can preferably be conductive tapes that are strip shaped, instead of being conductive wires. Thus, when the first bonding pads 215 and the second terminals 320 are electrically connected to each other by the conductive tapes, the size of the substrate 100 is not limited and it is not necessary to define the opening 160 or the receiving groove 165 in the substrate 100. Accordingly in this embodiment the substrate 100 can be freely designed.

Figure 6:
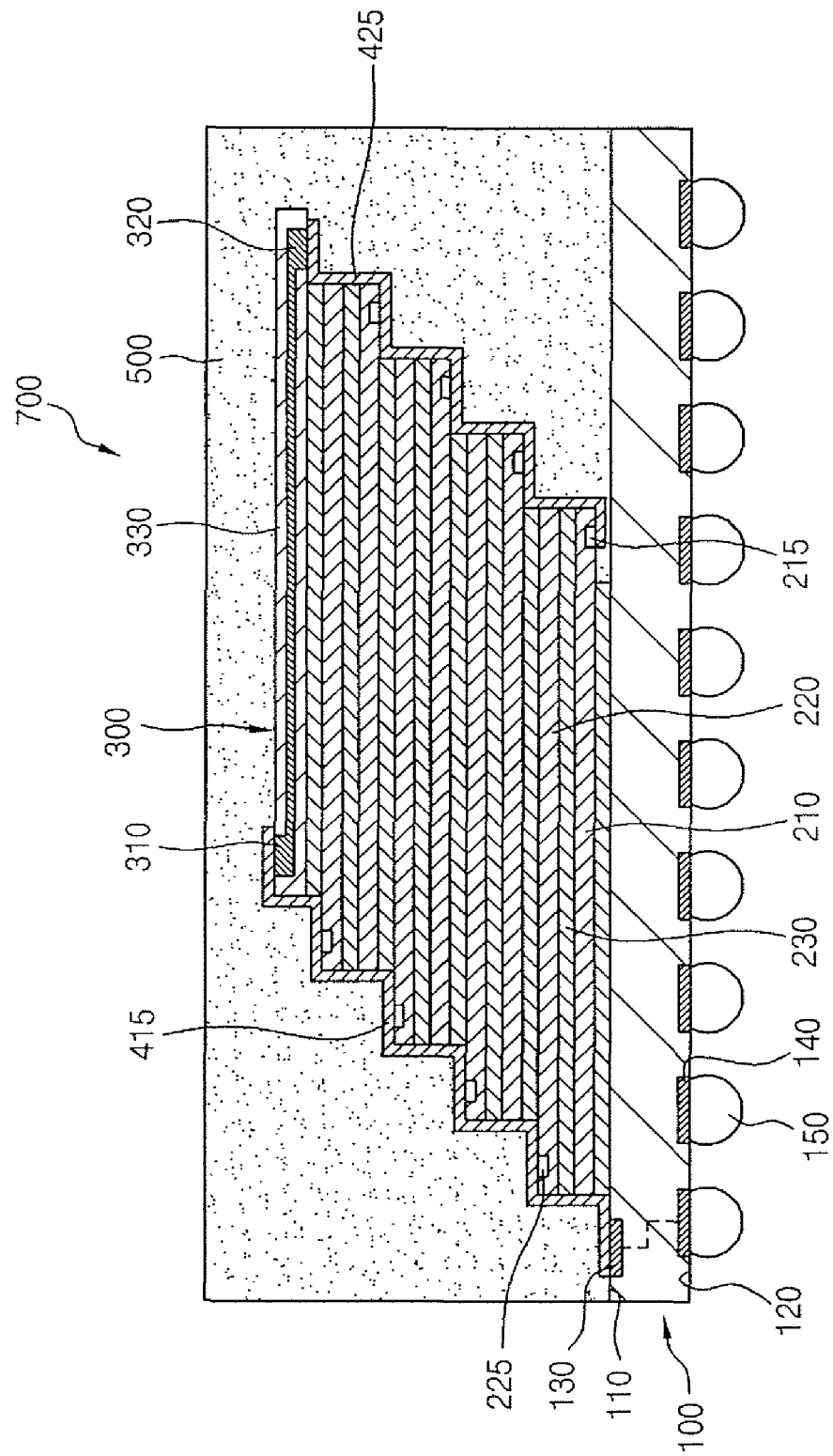
FIG. 6 is a sectional view illustrating a stacked semiconductor package in accordance with a fifth embodiment of the present invention.

Meanwhile, as shown in FIG. 6, like the second conductive members 425, first conductive members 415 can also be conductive tapes which have strip shapes.

Figure 7:
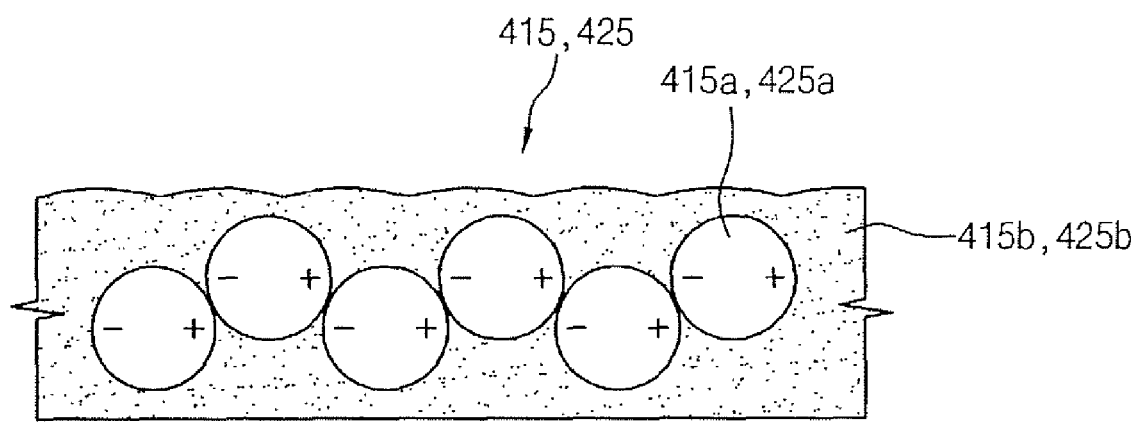
FIG. 7 is a sectional view illustrating first and second conductive members of a stacked semiconductor package in accordance with a sixth embodiment of the present invention.

Moreover, as shown in FIG. 7, the first and second conductive members 415 and 425 can comprise wiring parts 415a, 425a and insulation parts 415b, 425b. The wiring parts 415a, 425a composed of conductive rheological particles each of which has a first polarity and a second polarity which is opposite to the first polarity and which are electrically connected to one another. The insulation parts 415b, 425b enclose the wiring parts 415a, 425a.

Figure 8:
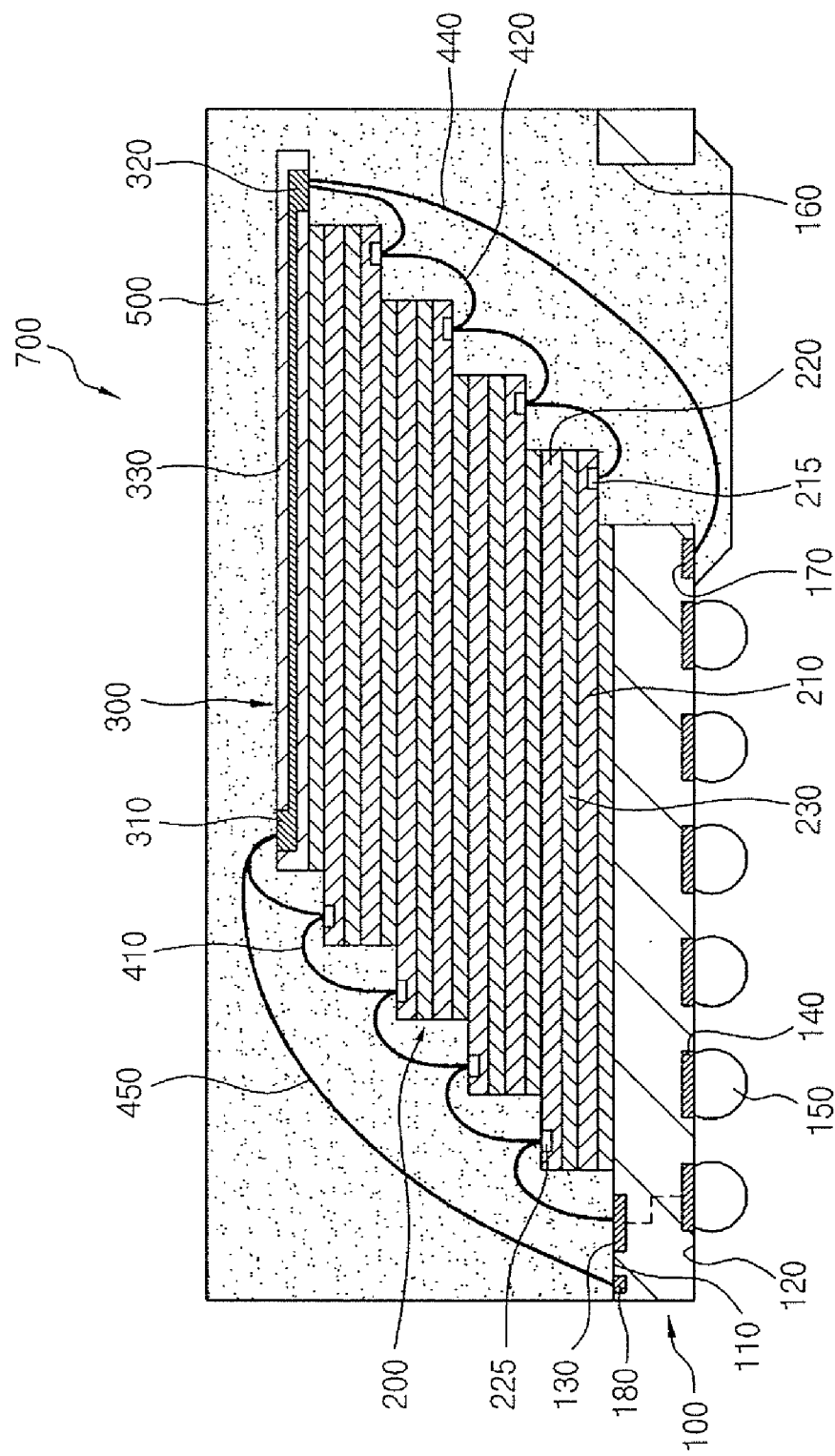
FIG. 8 is a sectional view illustrating a stacked semiconductor package in accordance with a seventh embodiment of the present invention.

Referring now to FIG. 8 which depicts a sectional view illustrating a stacked semiconductor package in accordance with a seventh embodiment of the present invention. The stacked semiconductor package shown in FIG. 8 has substantially the same construction as the stacked semiconductor package which is described above with reference to FIG. 3, except with regards to first power lines and second power lines. Therefore, detailed description for the same component elements will be omitted herein, and the same technical terms and the same reference numerals will be used to refer to the same or like component elements.

A stacked semiconductor package 700 includes a substrate 100, semiconductor chip modules 200, at least one connection member 300, conductive members 400, and first and second power lines 440 and 450.

The semiconductor chip modules 200 are placed or step wise stacked onto the substrate 100, and the connection member 300 is placed on the uppermost semiconductor chip module 200. The conductive members 400 electrically connect together the substrate 100, the semiconductor chip modules 200 and the connection members 300.

The substrate 100 can comprise a printed circuit board which has a plate shape. The substrate 100 includes connection pads 130, ball lands 140, connection elements 150, an opening 160, and power connection terminals 170,180. In the present embodiment, the surface area of the substrate 100 is preferably greater than that of the semiconductor chip modules 200.

The connection pads 130 are placed along an edge of an upper surface 110 of the substrate 100, and the ball lands 140 are placed on a lower surface 120 of the substrate 100 which faces away from the upper surface 110. The connection pads 130 and the ball lands 140 are electrically connected to each other. The connection elements 150 are electrically connected to the respective ball lands 140.

The opening 160 of the substrate 100 exposes the first bonding pads 215 of the first semiconductor chips 210 of the semiconductor chip modules 200 and the second terminals 320. The second conductive members 420, such as being composed as conductive wires, are easily connected electrically to the first bonding pads 215 and the second terminals 320 through the opening 160. The first conductive members 410 such as conductive wires electrically connect together the connection pads 130, the second bonding pads 225 and the first terminals 310.

Power can be supplied to the first semiconductor chips 210 through the first bonding pads 215 after flowing through the connection pads 130, the second bonding pads 225 and the connection members 300. Due to this configuration, the first semiconductor chips 210 is prone to receiving insufficient amounts of power.

In the present embodiment, in order to protect against inadequate amounts of power being supplied to the first semiconductor chips 210, the power connection pads 170 are provided on the substrate 100 adjacent to the first bonding pads 215 of the lowermost first semiconductor chip 210. The power connection pads 170 and the second terminals 320 are electrically connected to each other by the first power lines 440. Due to this configuration, sufficient amounts of power can be supplied to the first semiconductor chips 210. Unlike this, in the present embodiment, the power connection pads 170 can be electrically connected with the first bonding pads 215 of the first semiconductor chips 210 by the first power lines 440.

Also, in order to protect against inadequate amounts of power being supplied to the second semiconductor chips 220, the power connection pads 180 are provided on the substrate 100 adjacent to the second bonding pads 225 of the lowermost second semiconductor chip 220. The power connection pads 180 and the first terminals 310 are electrically connected to each other by the second power lines 450. Due to this configuration, adequate amounts of power can be supplied to the second semiconductor chips 220, and thus the second semiconductor chips 220 can be protected from this potential power problem.

In the present embodiment, of the first power lines 440 and the second power lines 450, only the second power lines 450 can be used to connect to the power connection pads 180 and to the first terminals 310.

Figure 9:
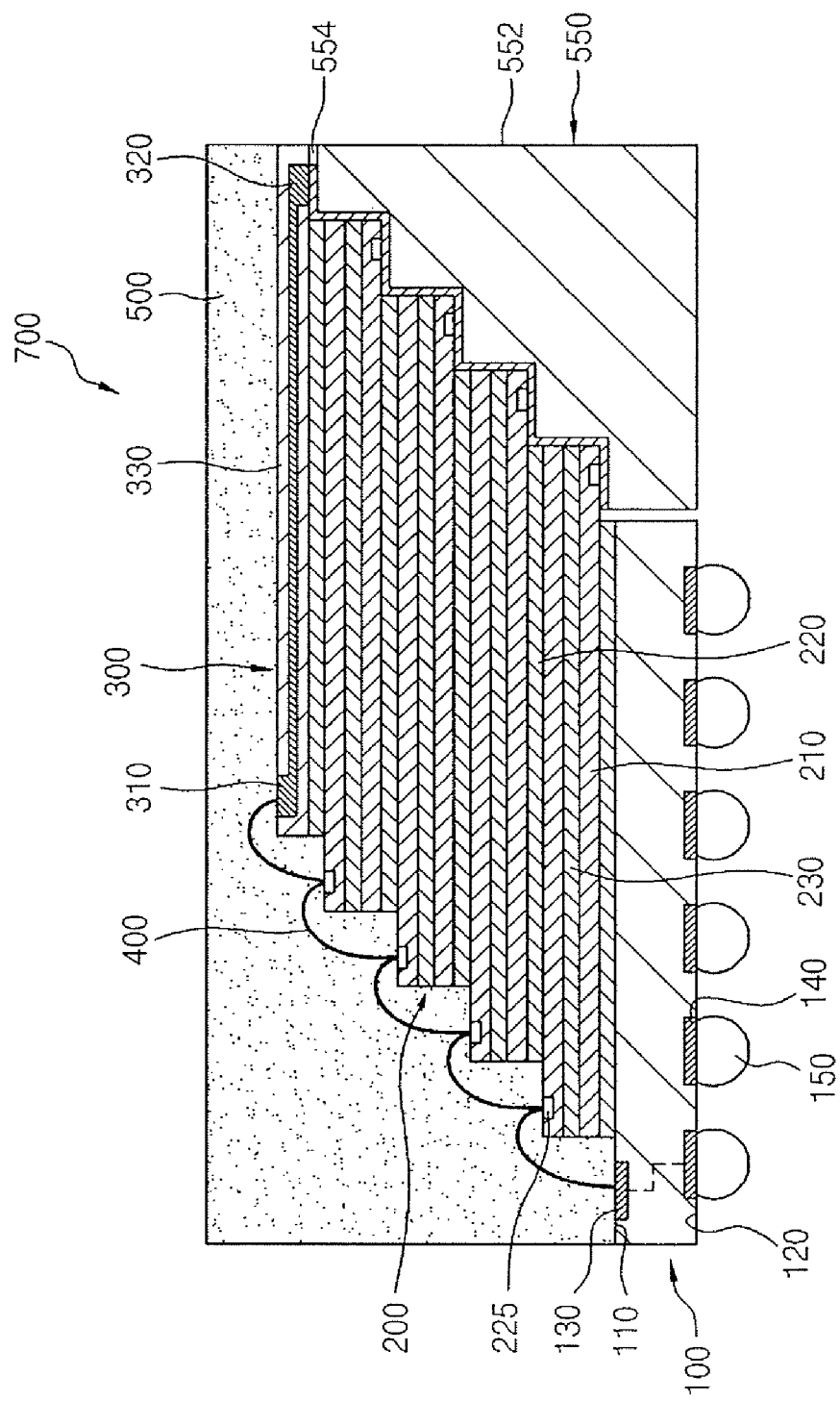
FIG. 9 is a sectional view illustrating a stacked semiconductor package in accordance with an eighth embodiment of the present invention.

Referring now to FIG. 9 which depicts a sectional view illustrating a stacked semiconductor package in accordance with an eighth embodiment of the present invention. The stacked semiconductor package shown in FIG. 9 has substantially the same construction as the stacked semiconductor package which is described above with reference to FIG. 1, except with regards to a connection block. Therefore, detailed description for the same component elements will be omitted herein, and the same technical terms and the same reference numerals will be used to refer to the same or like component elements.

A stacked semiconductor package 700 includes a substrate 100, semiconductor chip modules 200, at least one connection member 300, conductive members 400, and a connection block 550.

The semiconductor chip modules 200 are placed or stepwise stacked onto the substrate 100, and the connection members 300 is placed on the uppermost semiconductor chip module 200.

The conductive members 400 electrically connect together the substrate 100, the second bonding pads 225 of the second semiconductor chips 220 of the semiconductor chip modules 200, and the first terminals 310 of the connection members 300. In the present embodiment, the conductive members 400 can preferably be conductive wires. Alternately, the conductive members 400 can be conductive tapes.

The connection block 550 includes a connection block body 552 and connection patterns 554. The connection block body 552 has a configuration that defines steps to be engaged with the upper and side surfaces of the first semiconductor chips 210. That is, the connection block body 552 defines upwardly facing steps that are to be engaged with the downwardly facing steps of the semiconductor chip modules 200. The connection patterns 554 are placed on the connection block body 552 and connect to the second terminals 320 and to the first bonding pads 215.

Figure 10:
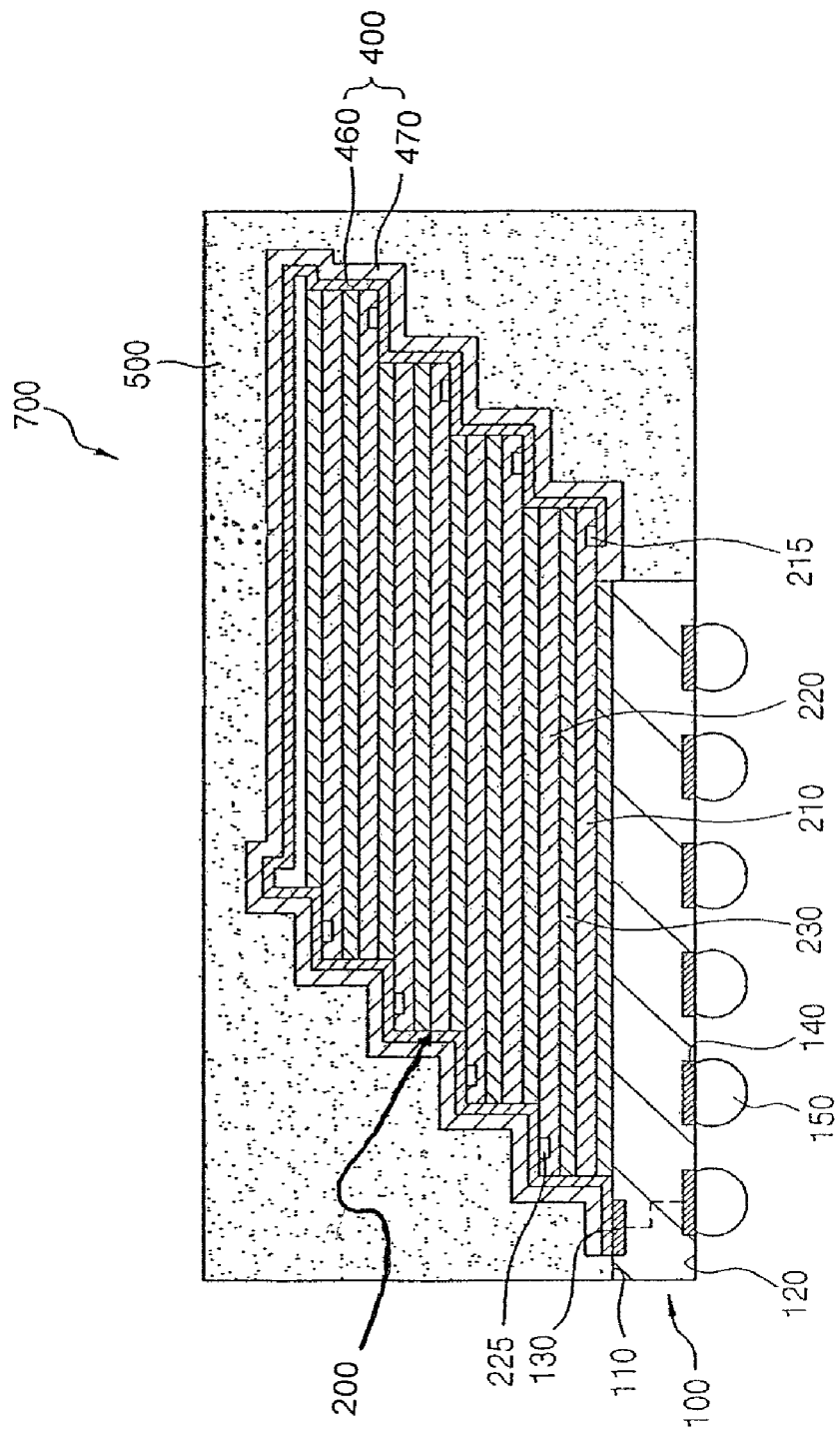
FIG. 10 is a sectional view illustrating a stacked semiconductor package in accordance with a ninth embodiment of the present invention.

Referring now to FIG. 10 which depicts a sectional view illustrating a stacked semiconductor package in accordance with a ninth embodiment of the present invention. The semiconductor chip modules and the substrate of the stacked semiconductor package shown in FIG. 10 are substantially the same as those of the stacked semiconductor package shown in FIG. 1. Therefore, detailed description for the same component elements will be omitted herein, and the same technical terms and the same reference numerals will be used to refer to the same or like component elements.

Referring to FIG. 10, a stacked semiconductor package 700 includes a substrate 100, semiconductor chip modules 200, and at least one conductive member 400.

The conductive member 400 includes a strip shaped conductive pattern 460 and a flexible body 470. In the present embodiment, the conductive pattern 460 can be metal pattern, a lead frame or a conductive tape.

The conductive pattern 460 is sequentially connected to the connection pads 130 of the substrate 100, to the second bonding pads 225 of the second semiconductor chips 220, and to the first bonding pads 215 of the first semiconductor chips 210.

The flexible body 470 is placed along the substrate 100 and the semiconductor chip modules 200. The conductive pattern 460 is placed inside the flexible body 470. The conductive pattern 460 and the first bonding pads 215, and the conductive patterns 460 and the second bonding pads 225 can be electrically connected to each other by connection elements such as solder.

As is apparent from the above description, in the present invention, since an increased number of semiconductor chips can be mounted in a unit volume, data storage capacity and data processing speed can be increased.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A stacked semiconductor package comprising:
a substrate having connection pads along an edge of an upper surface of the substrate;
a plurality of semiconductor chip modules stacked together in a step wise manner, each semiconductor chip module including:
a first semiconductor chip having first bonding pads placed along an edge of an upper surface of the first semiconductor chip wherein the upper surface of the first semiconductor faces the substrate and the first bonding pads are exposed such that the first bonding pads face-down towards the substrate; and
a second semiconductor chip having second bonding pads placed along an edge of an upper surface of the second semiconductor chip and having a lower surface of the second semiconductor chip facing over a lower surface of the first semiconductor chip wherein the second bonding pads are exposed such that the second bonding pads face-up away from the substrate;
a connection member having first terminals on a first surface and having second terminals on an opposing surface, the opposing surface of the connection member placed over the second semiconductor chip of an uppermost semiconductor chip module such that the second terminals are exposed and face-down towards the substrate and the first terminals are exposed and face-up away from the substrate; and
conductive members including
first conductive members that couple together the connection pads, the second bonding pads and the first terminals and
second conductive members that couple together the second terminals of the connection member and the first bonding pads of the first semiconductor chip of each semiconductor chip module.

2. The stacked semiconductor package according to claim 1, further comprising adhesive members attaching together the first and second semiconductor chips of each respective semiconductor chip module.

3. The stacked semiconductor package according to claim 1, wherein the first and second semiconductor chips of the semiconductor chip modules are substantially the same size.

4. The stacked semiconductor package according to claim 1, further comprising a molding member encasing the stacked plurality of semiconductor chip modules.

5. The stacked semiconductor package according to claim 1, wherein the first and second bonding pads of the first and second semiconductor chips of each semiconductor module face away from each other.

6. The stacked semiconductor package according to claim 1, wherein the first and second conductive members are conductive wires.

7. The stacked semiconductor package according to claim 6, wherein the substrate has a receiving groove defined to correspond and to receive the second conductive members coupled to a lowermost semiconductor chip module.

8. The stacked semiconductor package according to claim 6, wherein the substrate has an opening defined to correspond and to expose the second conductive members coupled to the second semiconductor chip of each semiconductor chip module and to correspond and to expose the second terminals of the conductive member.

9. The stacked semiconductor package according to claim 1, wherein the first conductive members are conductive wires, and the second conductive members are conductive tapes that are strip shaped.

10. The stacked semiconductor package according to claim 1, wherein the first and second conductive members are strip shaped conductive tapes.

11. The stacked semiconductor package according to claim 1, wherein the first and second conductive members comprise wiring parts composed of conductive Theological particles electrically connected with one another and insulation parts which enclose the wiring parts.

12. The stacked semiconductor package according to claim 1, wherein the substrate includes power connection terminals electrically coupled to the first and second terminals of the conductive member.

13. The stacked semiconductor package according to claim 1, wherein the connection member include an insulation layer which allows the first and second terminals to be exposed.

14. A stacked semiconductor package comprising:
a substrate having connection pads along an edge of an upper surface of the substrate;
a plurality of semiconductor chip modules, each semiconductor chip module including
a first semiconductor chip having first bonding pads placed along an edge of an upper surface of the first semiconductor chip wherein the upper surface of the first semiconductor faces the substrate and the first bonding pads are exposed such that the first bonding pads face-down towards the substrate; and
a second semiconductor chip having second bonding pads placed along an edge of an upper surface of the second semiconductor chip and having a lower surface of the second semiconductor chip facing over a lower surface of the first semiconductor chip wherein the second bonding pads are exposed such that the second bonding pads face-up away from the substrate;
a connection member having first terminals on a first surface and having second terminals on an opposing surface, the opposing surface of the connection member placed over the second semiconductor chip of an uppermost semiconductor chip module such that the second terminals are exposed and face-down towards the substrate and the first terminals are exposed and face-up away from the substrate;
conductive members coupling together the connection pads, the second bonding pads and the first terminals; and
a connection block on the substrate, the connection block including:
a connection block body configured to define steps for engaging a portion of the upper surface of the first semiconductor chip of each semiconductor chip module and engaging a side surface of each semiconductor chip module, and
connection pattern placed on the connection block body that electrically couple to the second terminals of the conductive member and couple to the first bonding pads of the first semiconductor chip of each semiconductor chip module.

15. The stacked semiconductor package according to claim 14, wherein the connection pattern comprises a strip shaped conductive tape.

16. The stacked semiconductor package according to claim 14 further comprising a molding member encasing the stacked plurality of semiconductor chip modules.

17. A stacked semiconductor package comprising:
a substrate having connection pads along an edge of an upper surface of the substrate;
a plurality of semiconductor chip modules stacked together in a step wise manner, each semiconductor chip module including:
a first semiconductor chip having first bonding pads placed along an edge of an upper surface of the first semiconductor chip wherein the upper surface of the first semiconductor faces the substrate and the first bonding pads are exposed such that the first bonding pads face-down towards the substrate; and
a second semiconductor chip having second bonding pads placed along an edge of an upper surface of the second semiconductor chip and having a lower surface of the second semiconductor chip facing over a lower surface of the first semiconductor chip wherein the second bonding pads are exposed such that the second bonding pads face-up away from the substrate;
a molding member encasing the stacked plurality of semiconductor chip modules; and
conductive member sequentially connected with the connection pads, the second bonding pads and the first bonding pads wherein the conductive member comprises a flexible body and a conductive pattern on the flexible body, the conductive pattern is electrically coupled to the connection pads, the second bonding pads and the first bonding pads.

18. The stacked semiconductor package according to claim 17, further comprising adhesive members attaching together the first and second semiconductor chips of each respective semiconductor chip module.

19. The stacked semiconductor package according to claim 17, wherein the conductive member comprise a lead frame.

* * * * *